(12) United States Patent
Deak et al.

(10) Patent No.: US 12,704,566 B2
(45) Date of Patent: Aug. 11, 2026

(54) MAGNETORESISTIVE RELAXATION OSCILLATOR TYPE MAGNETOMETER

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 276 days.

(21) Appl. No.: 18/000,191

(22) PCT Filed: May 27, 2021

(86) PCT No.: PCT/CN2021/096227

§ 371 (c)(1),
(2) Date: Nov. 18, 2024

(87) PCT Pub. No.: WO2021/239031

PCT Pub. Date: Dec. 2, 2021

(65) Prior Publication Data

US 2023/0273276 A1 Aug. 31, 2023

(30) Foreign Application Priority Data

May 29, 2020 (CN) ........................ 202010478494.X

(51) Int. Cl.
*G01R 33/09* (2006.01)
*G01R 33/00* (2006.01)
(Continued)

(52) U.S. Cl.
CPC ....... *G01R 33/091* (2013.01); *G01R 33/0041* (2013.01); *G01R 33/0206* (2013.01);
(Continued)

(58) Field of Classification Search
CPC ............ G01R 33/0041; G01R 33/0206; G01R 33/066; G01R 33/091; G01R 33/093; G01R 33/096; G01R 33/098; H03B 15/006
See application file for complete search history.

(56) References Cited

U.S. PATENT DOCUMENTS

| | | | | |
|---|---|---|---|---|
| 5,781,042 | A | 7/1998 | Jung | |
| 6,522,491 | B1 * | 2/2003 | Kawai | G11B 5/02 360/61 |

(Continued)

FOREIGN PATENT DOCUMENTS

| | | | |
|---|---|---|---|
| CN | 101902214 | A | 12/2010 |
| CN | 202748469 | U | 2/2013 |

(Continued)

OTHER PUBLICATIONS

Machine translation of CN 105068124 (Year: 2015).*

(Continued)

*Primary Examiner* — Steven L Yeninas
(74) *Attorney, Agent, or Firm* — Schwegman Lundberg & Woessner, P.A.

(57) ABSTRACT

A magnetoresistive relaxation oscillator magnetometer comprises a capacitor, a charging resistor, a discharging resistor, a charge-discharge transfer switch, a high-voltage source terminal, a grounding terminal and a signal output terminal (Vout). The charging resistor consists of at least one charging magnetoresistance unit, and the discharging resistor consists of at least one discharging magnetoresistance unit. The first end of the capacitor is connected to the grounding terminal, the second end of the capacitor is connected to the charging resistor, the discharging resistor and the signal output terminal (Vout) by means of the charge-discharge transfer switch, and the charge-discharge transfer switch is further connected to the high-voltage source terminal. In the (Continued)

charging state, the charge-discharge transfer switch is connected to the high-voltage source terminal, and the high-voltage source terminal charges the capacitor through the charging resistor; while in a discharging stage, the charge-discharge transfer switch is connected to the grounding terminal, so that the capacitor discharges through the grounding terminal by means of the discharging resistor. This device can provide rapid measurement of the external magnetic field magnitude.

13 Claims, 12 Drawing Sheets

(51) Int. Cl.
*G01R 33/02* (2006.01)
*G01R 33/06* (2006.01)
*H03B 15/00* (2006.01)

(52) U.S. Cl.
CPC ......... *G01R 33/093* (2013.01); *G01R 33/098* (2013.01); *H03B 15/006* (2013.01); *G01R 33/066* (2013.01); *G01R 33/096* (2013.01)

(56) References Cited

U.S. PATENT DOCUMENTS

2005/0219771 A1* 10/2005 Sato ...................... B82Y 25/00
2006/0221507 A1* 10/2006 Sato .................... G11B 5/3929 360/324
2010/0301957 A1 12/2010 Park et al.

FOREIGN PATENT DOCUMENTS

| | | | |
|---|---|---|---|
| CN | 103595244 | A | 2/2014 |
| CN | 104169732 | A | 11/2014 |
| CN | 105068124 | A | 11/2015 |
| CN | 107332394 | A | 11/2017 |
| CN | 206876848 | U | 1/2018 |
| CN | 109116273 | A | 1/2019 |
| CN | 109556647 | A | 4/2019 |
| CN | 111610473 | A | 9/2020 |
| JP | 2001083223 | A | 3/2001 |
| JP | 5612782 | B1 | 9/2014 |
| WO | WO-2021239031 | A1 | 12/2021 |

OTHER PUBLICATIONS

"Chinese Application No. 202010478494.X, Chinese Search Report dated Jan. 18, 2022", (Jan. 18, 2022), 2 pgs.
"Chinese Application No. 202010478494.X, First Office Action mailed Jan. 26, 2022", (Jan. 26, 2022), 12 pgs.
"Chinese Application No. 202010478494.X, Notification to Grant Patent Right for Invention mailed Oct. 14, 2022", (Oct. 14, 2022), 2 pgs.
"International Application No. PCT/CN2021/096227, International Search Report and Written Opinion mailed Aug. 26, 2021", (Aug. 26, 2021), 11 pgs.

* cited by examiner

MAGNETORESISTIVE RELAXATION OSCILLATOR TYPE MAGNETOMETER

PRIORITY CLAIM TO RELATED APPLICATIONS

This application is a U.S. national stage filing under 35 U.S.C. § 371 from International Application No. PCT/CN2021/096227, filed on 27 May 2021, and published as WO2021/239031 on 2 Dec. 2021, which claims the benefit under 35 U.S.C. 119 to Chinese Application No. 202010478494.X, filed on 29 May 2020, the benefit of priority of each of which is claimed herein, and which applications and publication are hereby incorporated herein by reference in their entirety.

TECHNICAL FIELD

The present disclosure relates to the technical field of magnetic sensors, in particular to a magnetoresistive relaxation oscillator type magnetometer.

BACKGROUND

A magnetoresistive sensor has 1/f noise when normally used, and lowering the noise of the magnetoresistive sensor and developing a low-noise magnetoresistve sensor have great significance to improve accurate measurement of magnetic signals.

Generally, the magnetoresistive sensor has high noise of 1/f at a low frequency, and mainly has thermal noise at a high frequency, of which a noise energy density is greatly lower than a noise energy density at the low frequency. Therefore, at present, it is a most common choice to pre-tune a magnetic signal to a high-frequency magnetic field and then measure it by the magnetoresistive sensor to output a high-frequency voltage signal, and then perform demodulation, to achieve a purpose of moving measurement of the magnetic signal from a low-frequency zone to a high-frequency zone, and lowering the 1/f noise energy density.

However, an existing high-frequency magnetic signal measurement device has a complex structure and long measurement time.

SUMMARY

An embodiment of the present disclosure provides a magnetoresistive relaxation oscillator type magnetometer to implement rapid measurement of an external magnetic field.

An embodiment of the present disclosure provides a magnetoresistive relaxation oscillator type magnetometer, including: a capacitor, a charging resistor, a discharging resistor, a charge-discharge transfer switch, a high-voltage source terminal, a grounding terminal and a signal output terminal. The charging resistor consists of at least one charging magnetoresistance unit, and the discharging resistor consists of at least one discharging magnetoresistance unit.

A first end of the capacitor is connected to the grounding terminal, a second end of the capacitor is respectively connected to the charging resistor, the discharging resistor and the signal output terminal via the charge-discharge transfer switch, and the charge-discharge transfer switch is further connected to the high-voltage source terminal.

In a charging stage, the charge-discharge transfer switch is switched to the high-voltage source terminal, and the high-voltage source terminal charges the capacitor via the charging resistor; while in a discharging stage, the charge-discharge transfer switch is switched to the grounding terminal, so that the capacitor discharges to the grounding terminal via the discharging resistor.

When an external magnetic field causes resistance change in the charging resistor and the discharging resistor, charge-discharge time of the capacitor is changed, a pulse signal output by the signal output terminal contains one or more harmonic waves of the charging resistor or the discharging resistor, and a signal processing circuit measures the pulse signal to measure the external magnetic field.

According to the magnetoresistive relaxation oscillator type magnetometer provided by the embodiment of the present disclosure, periodic charge-discharge is performed by adopting the capacitor, the charging resistor and the discharging resistor, of which a charge-discharge period is directly proportional to a product of the capacitor and the charging-discharging resistors, so that the charging-discharging resistors are transformed into a charging pulse voltage and a discharging pulse voltage as a function of time within the charge-discharge period. Thus, the measurement time can be shortened, a signal-to-noise ratio is lowered, and the structure is simple.

BRIEF DESCRIPTION OF THE DRAWINGS

In order to describe embodiments of the present disclosure or the technical solutions in the prior art more clearly, accompanying drawings to be used in description of the embodiments or the prior art will be briefly introduced below, apparently, although the accompanying drawings in the following description are some specific embodiments of the present disclosure, for those skilled in the art, the basic concepts of device structures, driving methods and manufacturing methods disclosed and suggested by various embodiments of the present disclosure can be expanded and extended to other structures and drawings, which are undoubtedly within the scope of claims of the present disclosure.

DETAILED DESCRIPTION

Figure 1:
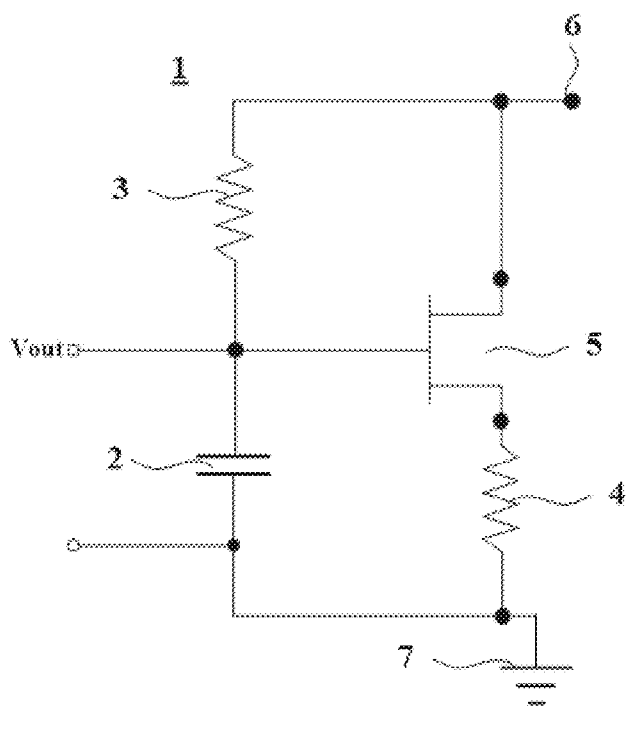
FIG. 1 is a schematic diagram of a magnetoresistive relaxation oscillator type magnetometer provided by an embodiment of the present disclosure.

In order to make the objectives, technical solutions and advantages of the present disclosure more clear, the technical solutions of the present disclosure will be clearly and completely described through implementations below with reference to the accompanying drawings in the embodiments of the present disclosure, and apparently, the described embodiments are a part of embodiments of the present disclosure, not all the embodiments. All other embodiments obtained by those skilled in the art based on basic concepts disclosed and suggested by the embodiments in the present disclosure belong to the scope of protection of the present disclosure.

An embodiment of the present disclosure provides a magnetoresistive relaxation oscillator type magnetometer, including: a capacitor, a charging resistor, a discharging resistor, a charge-discharge transfer switch, a high-voltage source terminal, a grounding terminal and a signal output terminal. The charging resistor consists of at least one charging magnetoresistance unit, and the discharging resistor consists of at least one discharging magnetoresistance unit. A first end of the capacitor is connected to the grounding terminal, a second end of the capacitor is respectively connected to the charging resistor, the discharging resistor and the signal output terminal via the charge-discharge transfer switch, and the charge-discharge transfer switch is further connected to the high-voltage source terminal. In a charging stage, the charge-discharge transfer switch is switched to the high-voltage source terminal, and the high-voltage source terminal charges the capacitor via the charging resistor; while in a discharging stage, the charge-discharge transfer switch is switched to the grounding terminal, so that the capacitor discharges to the grounding terminal via the discharging resistor. When an external magnetic field causes resistance change in the charging resistor and the discharging resistor, charge-discharge time of the capacitor is changed, a pulse signal output by the signal output terminal contains one or more harmonic waves of the charging resistor or the discharging resistor, and a signal processing circuit measures the pulse signal to measure the external magnetic field.

Optionally, the charging magnetoresistance unit and the discharging magnetoresistance unit are anisotropic magnetoresistance units, giant magnetoresistance units or tunnel magnetoresistance units.

According to the magnetoresistive relaxation oscillator magnetometer provided by the embodiment of the present disclosure, periodic charge-discharge is performed by adopting the capacitor, the charging resistor and the discharging resistor, of which a charge-discharge period is directly proportional to a product of the capacitor and the charging-discharging resistors, so that the charging-discharging resistors are transformed into a charging pulse voltage and a discharging pulse voltage as a function of time within the charge-discharge period. Thus, the measurement time can be shortened, a signal-to-noise ratio is lowered, and the structure is simple.

The above is the core idea of the present disclosure, and the technical solutions in the embodiments of the present disclosure will be clearly and completely described below in combination with the accompanying drawings in the embodiments of the present disclosure. All other embodiments obtained by those skilled in the art based on the embodiments in the present disclosure without creative labor belong to the scope of protection of the present disclosure.

Referring to FIG. 1, it is a schematic diagram of a magnetoresistive relaxation oscillator type magnetometer provided by an embodiment of the present disclosure. The magnetoresistive relaxation oscillator type magnetometer 1 includes: a capacitor 2, a charging resistor 3, a discharging resistor 4, a charge-discharge transfer switch 5, a high-voltage source terminal 6, a grounding terminal 7 and signal output terminals Vout. The charging resistor 3 consists of at least one charging magnetoresistance unit, and the discharging resistor 4 consists of at least one discharging magnetoresistance unit. A first end of the capacitor 2 is connected to the grounding terminal 7. Optionally, the charge-discharge transfer switch 5 is a metal-oxide semiconductor field effect transistor MOSFET, wherein a second end of the capacitor 2 and a second end of the charging resistor 3 are both connected to a gate of the MOSFET 5, the discharging resistor 4 is located between a drain of the MOSFET 5 and the grounding terminal 7, and the high-voltage source terminal 6 is respectively connected to a first end of the charging resistor 3 and a source of the MOSFET 5. The two ends of the capacitor 2 are the signal output terminals Vout.

Figure 2:
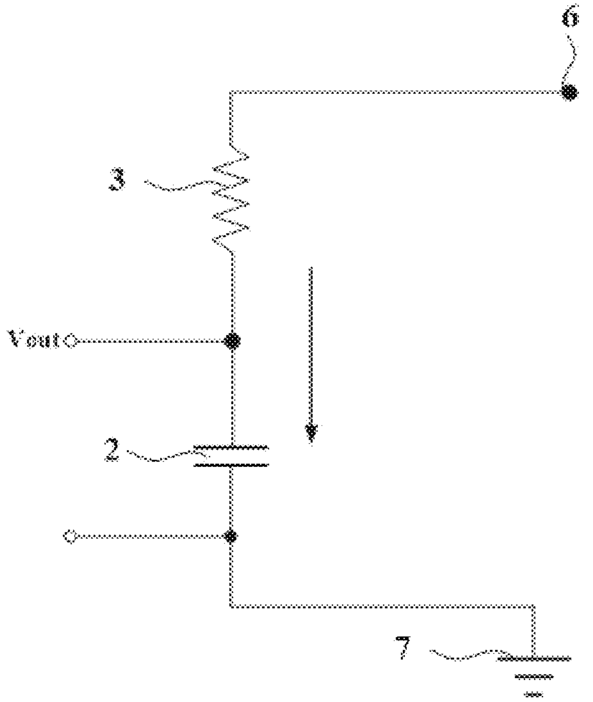
FIG. 2 is a schematic diagram of charging for FIG. 1.
Figure 3:
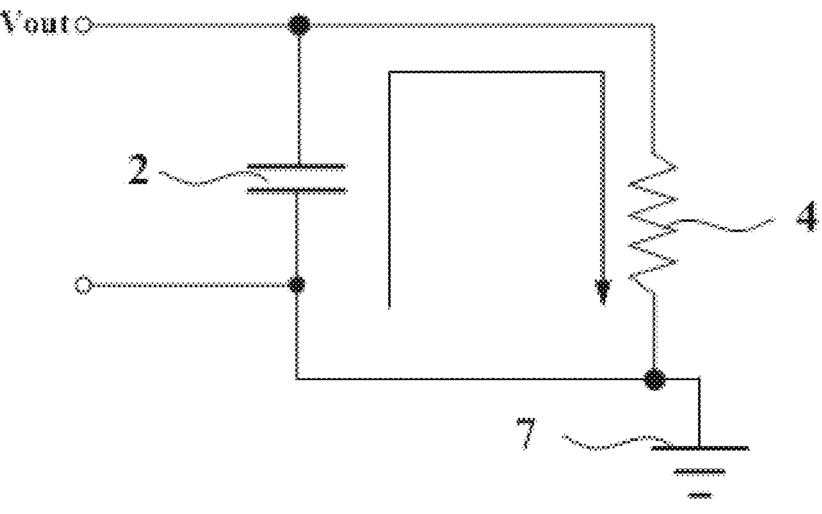
FIG. 3 is a schematic diagram of discharging for FIG. 1.

In the embodiment, the capacitor 2 is located between the gate of the MOSFET 5 and the grounding terminal 7, and the charging resistor 3 is located between the high-voltage source terminal 6 and the gate of the MOSFET 5. As shown in FIG. 2, in a charging stage, the charge-discharge transfer switch 5 is switched to the high-voltage source terminal 6, that is, the MOSFET 5 is turned off, the charge-discharge transfer switch 5 is cut off from the high-voltage source terminal 6, and the high-voltage source terminal 6 charges the capacitor 2 via the charging resistor 3, with a path of a charging branch as shown by the arrow. As shown in FIG. 3, in a discharging stage, the charge-discharge transfer switch 5 is switched to the grounding terminal 7, that is, the MOSFET 5 is turned on, the charge-discharge transfer switch 5 is conducted to the grounding terminal 7, and the capacitor 2 discharges to the grounding terminal 7 via the discharging resistor 4, with a path of a discharging branch as shown by the arrow.

An external magnetic field is applied to the magnetometer 1, in the charging stage, the external magnetic field causes resistance change in the charging resistor 3, in the discharging stage, the external magnetic field causes resistance change in the discharging resistor 4, and thus charge-discharge time of the capacitor is changed. The signal output terminals output a charging pulse voltage signal in the charging stage, the charging pulse voltage signal contains one or more harmonic waves of the charging resistor, the signal output terminals output a discharging pulse voltage signal in the discharging stage, and the discharging pulse voltage signal contains one or more harmonic waves of the discharging resistor. A signal processing circuit measures the pulse signals of the signal output terminals to measure the magnitude of the external magnetic field.

Figure 4:
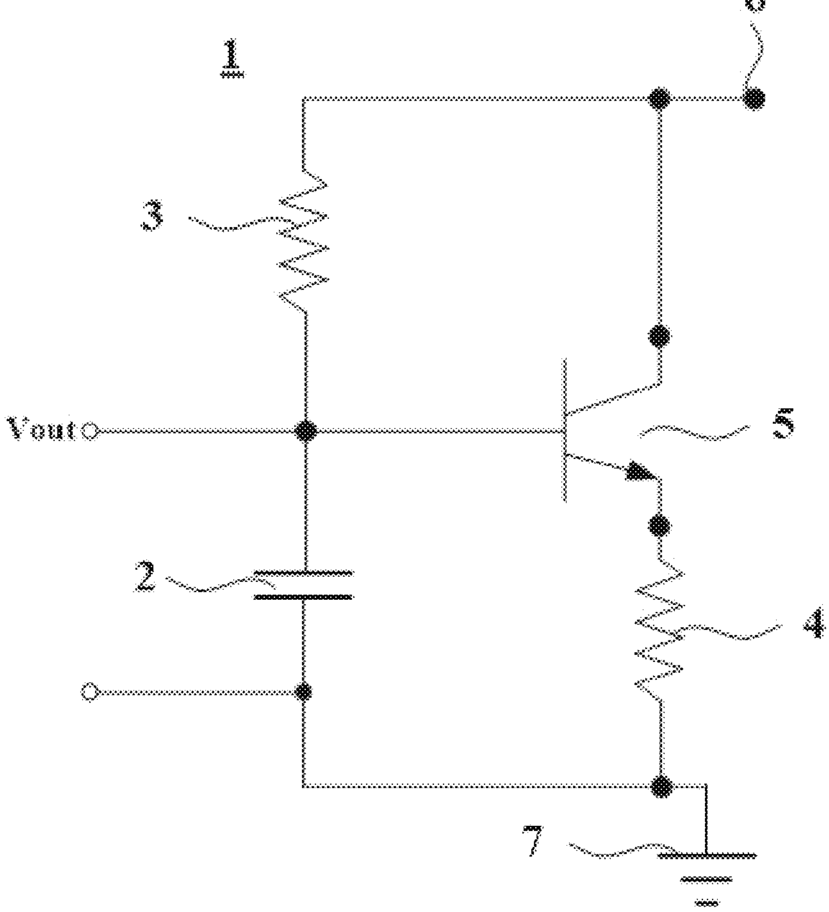
FIG. 4 is a schematic diagram of a magnetoresistive relaxation oscillator type magnetometer provided by an embodiment of the present disclosure.

In other embodiments, it is further optional that the charge-discharge transfer switch 5 as shown in FIG. 4 is a triode, wherein the second end of the capacitor 2 and the second end of the charging resistor 3 are both connected to a base of the triode 5, the discharging resistor 4 is located between an emitter of the triode 5 and the grounding terminal 7, and the high-voltage source terminal 6 is respectively connected to the first end of the charging resistor 3 and a collector of the triode 5.

Optionally, the charging resistor and the discharging resistor are opposite in magnetic field sensitive direction and same in sensitivity, and are the same in resistance when no external magnetic field is applied and form a push-pull type magnetoresistor. Optionally, the charging resistor is a magnetic field sensitive magnetoresistance unit.

Figure 5:
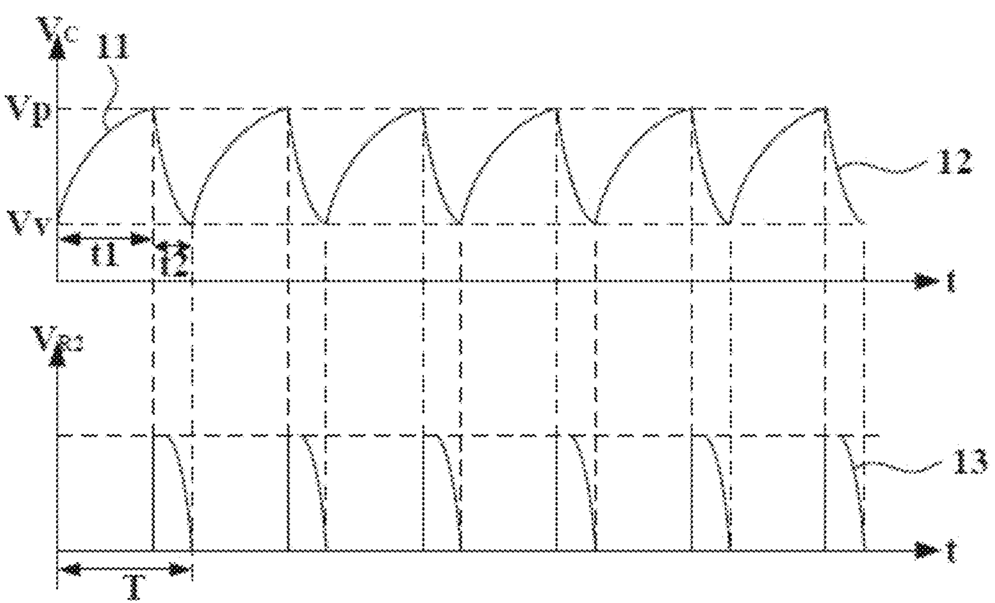
FIG. 5 is a schematic diagram of a voltage $V_C(t)$ across a capacitor and a voltage $V_{R2}(t)$ across a discharging resistor in FIG. 1.

FIG. 5 is a schematic diagram of a voltage $V_C(t)$ across the capacitor and a voltage $V_{R2}(t)$ across the discharging resistor in the magnetometer 1, wherein voltage signals $V_C(t)$ across the capacitor are the pulse signals output by the signal output terminals.

It can be seen from FIG. 5 that, in the charging stage, a charging characteristic curve 11 produced by the voltage $V_C(t)$ across the capacitor is an exponential increasing function, and an expression of the charging characteristic curve 11 is a formula (1); and in the discharging stage, a discharging characteristic curve 12 produced by the voltage $V_C(t)$ across the capacitor is an exponential decreasing function, and an expression of the discharging characteristic curve 12 is a formula (2).

$$V_C(t) = V_0\left(1 - e^{-\frac{t2}{R_1C}}\right); \tag{1}$$

$$V_C(t) = V_0 e^{-\frac{t1}{R_2C}}; \tag{2}$$

$V_0$ is a charging final voltage or a discharging initial voltage, $t_1$ is charging time, $t_2$ is discharging time, $R_1$ is a resistance value of the charging resistor, $R_2$ is a resistance value of the discharging resistor, and C is a capacitance value of the capacitor.

It can thus be seen that the charging time $t_1$ of the voltage Vc(t) across the capacitor in the charging stage is determined by an R1*C time constant, while the discharging time $t_2$ of the voltage Vc(t) across the capacitor in the discharging stage is determined by an R2*C time constant.

It can be seen from FIG. 5 that $V_P$ is a peak voltage of the capacitor in the charging and discharging processes, $V_V$ is a valley voltage of the capacitor in the charging and discharging processes, and in the charging stage, a current and a voltage of the voltage $V_{R2}(t)$ across the discharging resistor are both 0; and the voltage $V_{R2}(t)$ across the discharging resistor only exists in the discharging stage. Therefore, a pulse period of the voltage $V_{R2}(t)$ across the discharging resistor is $T=t_1+t_2$.

Figure 6:
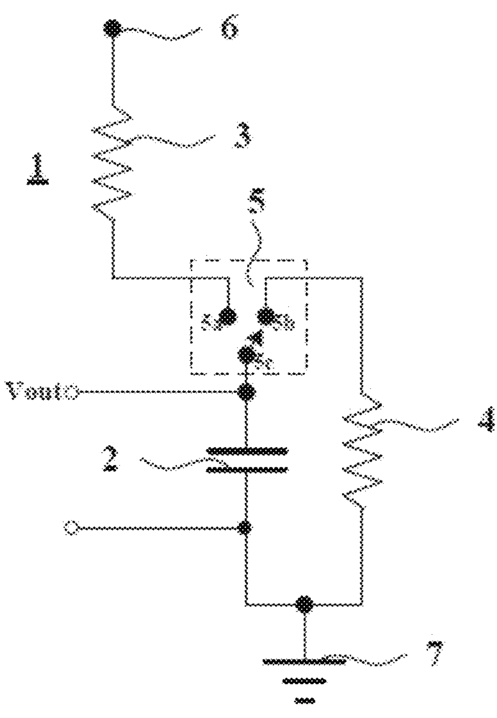
FIG. 6 is a schematic diagram of a magnetoresistive relaxation oscillator type magnetometer provided by an embodiment of the present disclosure.

Referring to FIG. 6, it is a schematic diagram of a magnetoresistive relaxation oscillator type magnetometer provided by an embodiment of the present disclosure. The magnetoresistive relaxation oscillator type magnetometer 1 includes: a capacitor 2, a charging resistor 3, a discharging resistor 4, a charge-discharge transfer switch 5, a high-voltage source terminal 6, a grounding terminal 7 and a signal output terminal Vout. The charging resistor 3 consists of at least one charging magnetoresistance unit, and the discharging resistor 4 consists of at least one discharging magnetoresistance unit. A first end of the capacitor 2 is connected to the grounding terminal 7. Optionally, the charge-discharge transfer switch 5 is a triode bidirectional switch, including an on end 5*a*, an off end 5*b* and a connecting end 5*c*, wherein the high-voltage source end 6 is connected with the on end 5*a* via the charging resistor 3, the grounding terminal 7 is connected with the off end 5*b* via the discharging resistor 4, and a second end of the capacitor 2 is connected with the connecting end 5*c*. In a charging stage, the on end 5*a* is conducted to the connecting end 5*c*, and in a discharging stage, the off end 5*b* is conducted to the connecting end 5*c*.

Optionally, the charging resistor and the discharging resistor are opposite in magnetic field sensitive direction and same in sensitivity, and are the same in resistance when no external magnetic field is applied and form a push-pull type magnetoresistor. Optionally, the charging resistor is a magnetic field sensitive magnetoresistance unit.

Figure 7:
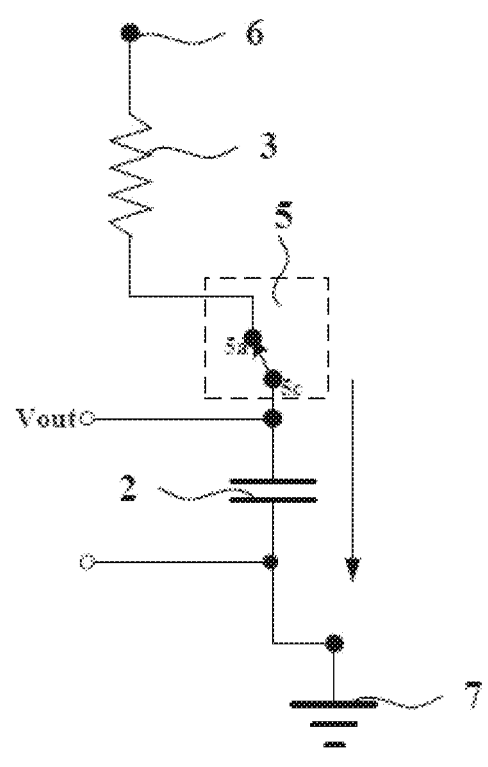
FIG. 7 is a schematic diagram of charging for FIG. 6.
Figure 8:
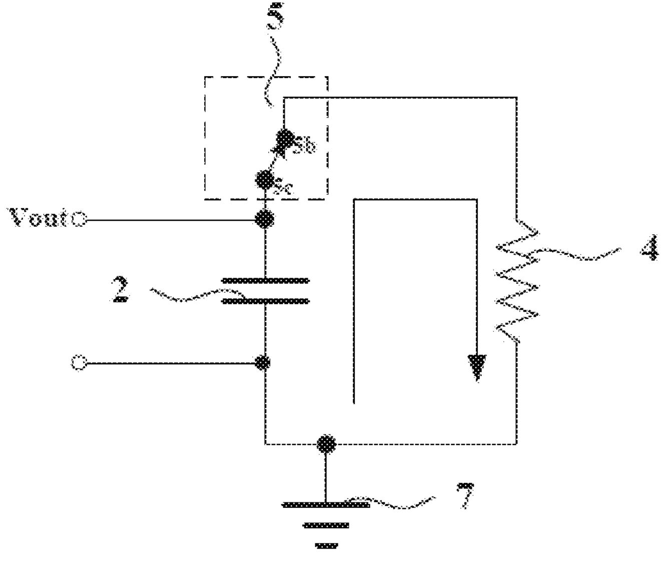
FIG. 8 is a schematic diagram of discharging for FIG. 6.

In the embodiment, the capacitor 2 is located between the connecting end 5*c* of the charge-discharge transfer switch 5 and the grounding terminal 7, the charging resistor 3 is located between the high-voltage source terminal 6 and the on end 5*a* of the charge-discharge transfer switch 5, and the discharging resistor 4 is located between the grounding terminal 7 and the off end 5*b* of the charge-discharge transfer switch 5. As shown in FIG. 7, in the charging stage, the charge-discharge transfer switch 5 is switched to the high-voltage source terminal 6, that is, the on end 5*a* is conducted to the connecting end 5*c* of the charge-discharge transfer switch 5, and the high-voltage source terminal (+Vdd) 6 charges the capacitor 2 via the charging resistor 3, with a path of a charging branch as shown by the arrow. As shown in FIG. 8, in the discharging stage, the charge-discharge transfer switch 5 is switched to the grounding terminal 7, that is, the off end 5*b* is conducted to the connecting end 5*c* of the charge-discharge transfer switch 5, and the capacitor 2 discharges to the grounding terminal 7 via the discharging resistor 4, with a path of a discharging branch as shown by the arrow.

An external magnetic field is applied to the magnetometer 1, in the charging stage, the external magnetic field causes resistance change in the charging resistor 3, in the discharging stage, the external magnetic field causes resistance change in the discharging resistor 4, and thus charge-discharge time of the capacitor is changed. The signal output terminal outputs a charging pulse voltage signal in the charging stage, the charging pulse voltage signal contains one or more harmonic waves of the charging resistor, the signal output terminal outputs a discharging pulse voltage signal in the discharging stage, and the discharging pulse voltage signal contains one or more harmonic waves of the discharging resistor. A signal processing circuit measures the pulse signals of the signal output terminal to measure the magnitude of the external magnetic field.

Figure 9:
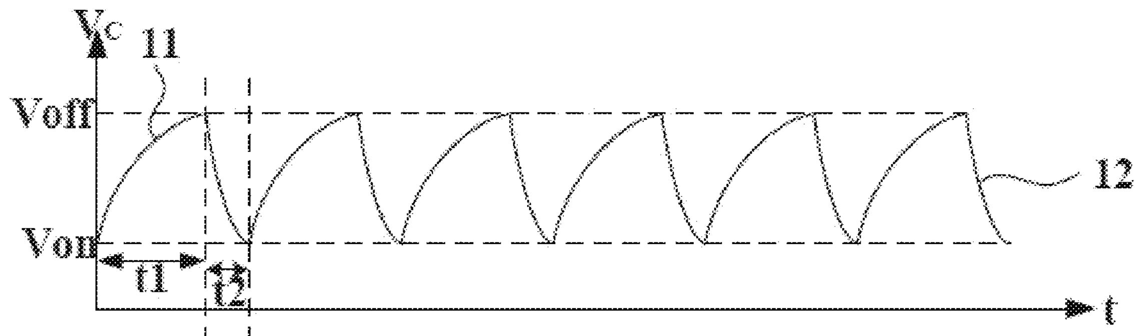
FIG. 9 is a schematic diagram of a voltage $V_C(t)$ across a capacitor in FIG. 6.

FIG. 9 is a schematic diagram of a voltage $V_C(t)$ across the capacitor in the magnetometer 1, wherein voltage signals $V_C(t)$ across the capacitor are the pulse signals output by the signal output terminal.

It can be seen from FIG. 9 that, in the charging stage, a charging characteristic curve 11 produced by the voltage $V_C(t)$ across the capacitor is an exponential increasing function, and in the discharging stage, a charging characteristic curve 12 produced by the voltage $V_C(t)$ across the capacitor is an exponential decreasing function. The charging time $t_1$ of the voltage $V_C(t)$ across the capacitor in the charging stage is determined by an $R_1$*C time constant, while the discharging time $t_2$ of the voltage $V_C(t)$ across the capacitor in the discharging stage is determined by an $R_2$*C time constant.

Figure 10:
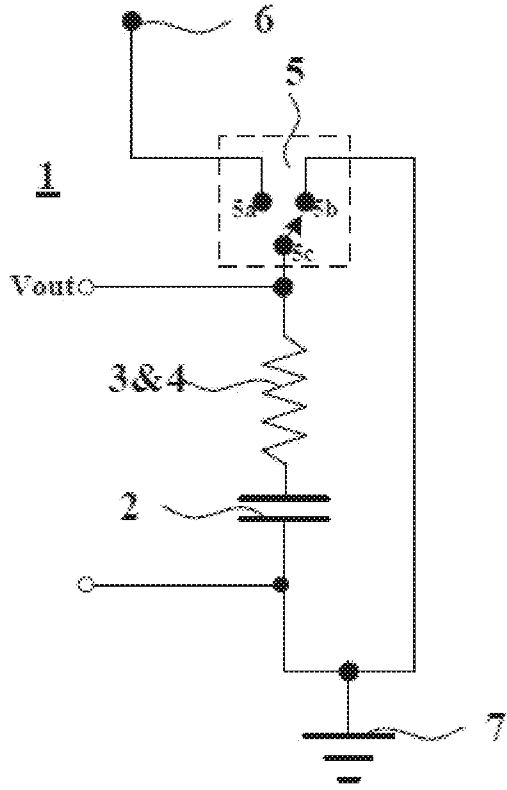
FIG. 10 is a schematic diagram of a magnetoresistive relaxation oscillator type magnetometer provided by an embodiment of the present disclosure.

Referring to FIG. 10, it is a schematic diagram of a magnetoresistive relaxation oscillator type magnetometer provided by an embodiment of the present disclosure. The magnetoresistive relaxation oscillator type magnetometer 1 includes: a capacitor 2, a charging resistor 3, a discharging resistor 4, a charge-discharge transfer switch 5, a high-voltage source terminal 6, a grounding terminal 7 and a signal output terminal Vout. The charging resistor 3 consists of at least one charging magnetoresistance unit, and the discharging resistor 4 consists of at least one discharging magnetoresistance unit. A first end of the capacitor 2 is connected to the grounding terminal 7. Optionally, the charge-discharge transfer switch 5 is a triode bidirectional switch, including an on end 5*a*, an off end 5*b* and a connecting end 5*c*, wherein the charging resistor and the discharging resistor are the same one common resistor 3&4, a second end of the capacitor 2 and the common resistor 3&4 are connected in series to form an RC series, the RC series is connected with the connecting end 5*c*, the high-voltage source terminal 6 is connected with the on end 5*a*, and the grounding terminal 7 is connected with the off end 5*b*. In a charging stage, the on end 5*a* is conducted to the connecting end 5*c*, and in a discharging stage, the off end 5*b* is conducted to the connecting end 5*c*.

Figure 11:
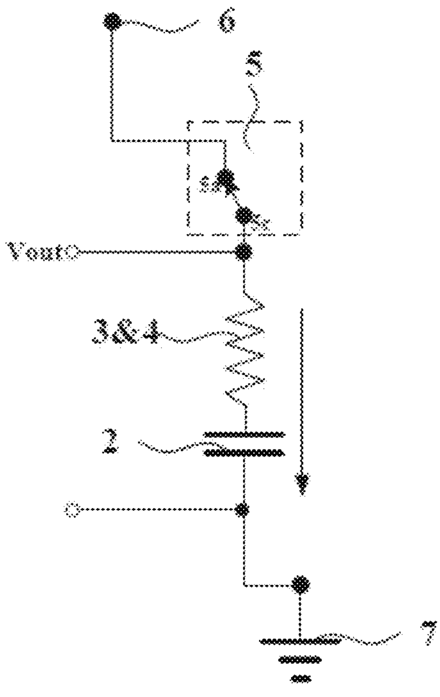
FIG. 11 is a schematic diagram of charging for FIG. 10.
Figure 12:
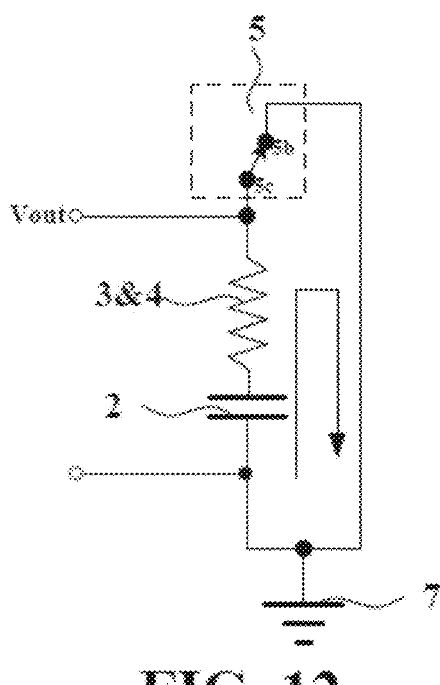
FIG. 12 is a schematic diagram of discharging for FIG. 10.

In the embodiment, the common resistor 3&4 are provided, the common resistor 3&4 is multiplexed as the charging resistor and the discharging resistor, the common resistor 3&4 and the second end of the capacitor 2 are electrically connected to form the RC series, and the RC series is located between the grounding terminal 7 and the connecting end 5*c* of the charge-discharge transfer switch 5. As shown in FIG. 11, in the charging stage, the charge-discharge transfer switch 5 is switched to the high-voltage source terminal 6, that is, the on end 5*a* is conducted to the connecting end 5*c* of the charge-discharge transfer switch 5, and the high-voltage source terminal (+Vdd) 6 charges the capacitor 2 via the common resistor 3&4, with a path of a charging branch as shown by the arrow. As shown in FIG. 12, in the discharging stage, the charge-discharge transfer switch 5 is switched to the grounding terminal 7, that is, the off end 5*b* is conducted to the connecting end 5*c* of the charge-discharge transfer switch 5, and the capacitor 2 discharges to the grounding terminal 7 via the common resistor 3&4, with a path of a discharging branch as shown by the arrow.

An external magnetic field is applied to the magnetometer 1, in the charging stage, the external magnetic field causes resistance change in the common resistor 3&4, in the discharging stage, the external magnetic field causes resistance change in the common resistor 3&4, and thus the charge-discharge time of the capacitor is changed. The signal output terminal outputs a charging pulse voltage signal in the charging stage, the charging pulse voltage signal contains one or more harmonic waves of the common resistor 3&4, the signal output terminal outputs a discharging pulse voltage signal in the discharging stage, and the discharging pulse voltage signal contains one or more harmonic waves of the common resistor 3&4. A signal processing circuit measures the pulse signals of the signal output terminal to measure the magnitude of the external magnetic field. The number of resistors is reduced in the embodiment.

Figure 13:
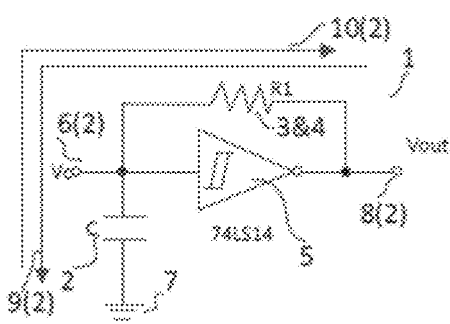
FIG. 13 is a circuit diagram of an equivalent trigger of FIG. 10.

FIG. 13 is a circuit diagram of an equivalent trigger of FIG. 10. The magnetometer 1 further includes: a low-voltage source terminal. The charge-discharge transfer switch is a trigger, an input terminal and an output terminal of the trigger are respectively the high-voltage source terminal or the low-voltage source terminal, the charging resistor and the discharging resistor are the same one common resistor, the second end of the capacitor is connected to the input terminal of the trigger, the two ends of the common resistor are respectively connected to the input terminal and the output terminal of the trigger, and the signal output terminal is located at the output terminal or the input terminal of the trigger. The charge-discharge transfer switch 5 is a Schimit trigger, with the input terminal 6(2) and the output terminal 8(2) as the high-voltage source terminal and the low-voltage source terminal respectively. The capacitor 2 is connected between the grounding terminal 7 and the input terminal 6(2), and the two ends of the common resistor 3&4 are respectively connected between the input terminal 6(2) and the output terminal 8(2) of the trigger 5.

In the charging stage, the output terminal 8(2) is the high-voltage source terminal, the input terminal 6(2) is the low-voltage source terminal, the output terminal 8(2) charges the capacitor 2 via the common resistor 3&4, and the voltage across the capacitor 2 increases. If the voltage across the capacitor 2 is higher than a threshold value Vph, voltage switching occurs across the trigger 5, that is, the input terminal 6(2) is the high-voltage source terminal, and the output terminal 8(2) is the low-voltage source terminal, and then it enters the discharging stage. In the discharging stage, the capacitor 2 starts to discharge, the voltage at the input terminal 6(2) is reduced, and if the voltage across the capacitor 2 is smaller than a threshold value Vp1, voltage reversal occurs at the input terminal 6(2) and the output terminal 8(2) again, and it enters a charging process. Therefore, the charging branch 9(2) and the discharging branch 10(2) are implemented via the Schimit trigger 5 and charging and discharging of the capacitor 2.

Figure 14:
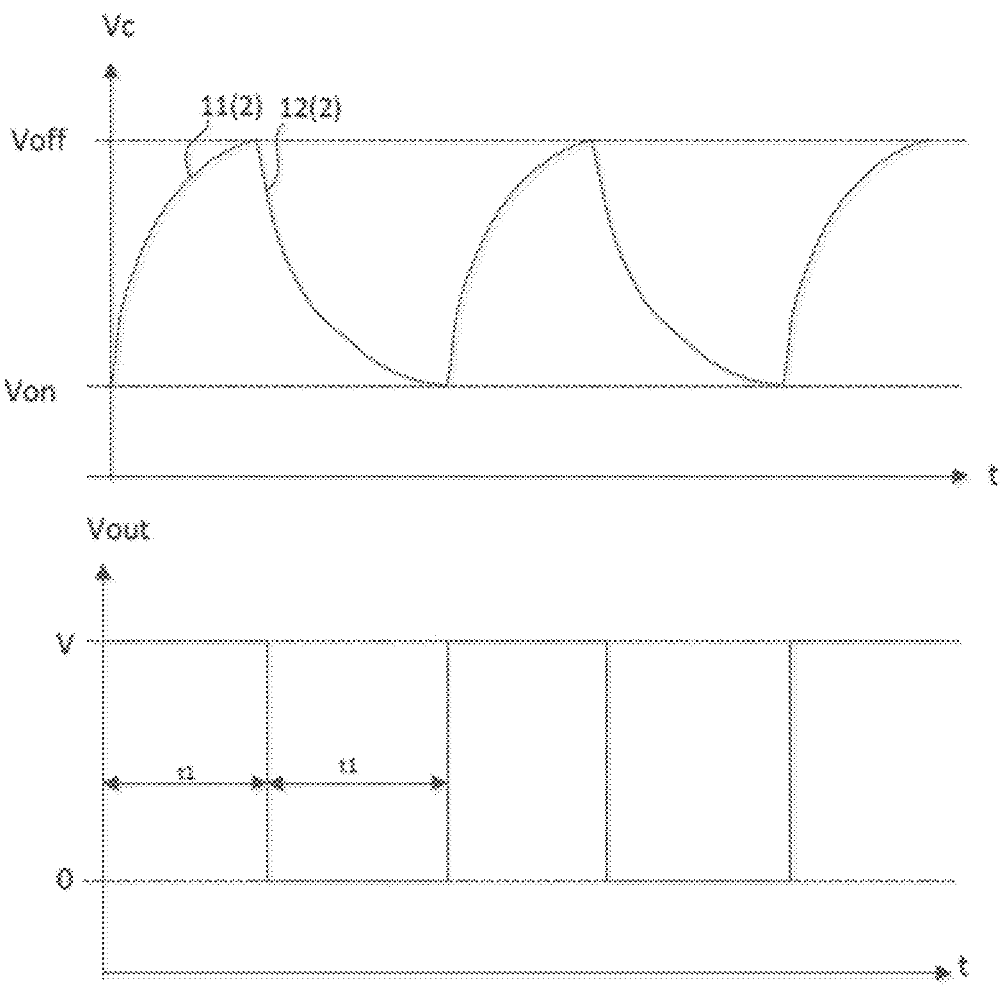
FIG. 14 is a schematic diagram of a capacitor voltage $V_C(t)$ and a voltage Vout(t) at an output terminal of a trigger in FIG. 10.

FIG. 14 is a schematic diagram of a capacitor voltage $V_C(t)$ and a voltage Vout(t) at the output terminal of the trigger in FIG. 10. $V_{off}$ is a peak voltage in the charging and discharging processes of the capacitor, $V_{on}$ is a valley voltage in the charging and discharging processes of the capacitor, in the charging stage, a charging characteristic curve 11(2) produced by the voltage $V_C(t)$ across the capacitor is an exponential increasing function, and in the discharging stage, a charging characteristic curve 12(2) produced by the voltage $V_C(t)$ across the capacitor is an exponential decreasing function. Vout(t) is high-low level pulse voltages, wherein charging time is $t_1$, discharging time is $t_2$, and the charging time $t_1$ is equal to the discharging time $t_2$.

Figures 15, 16:
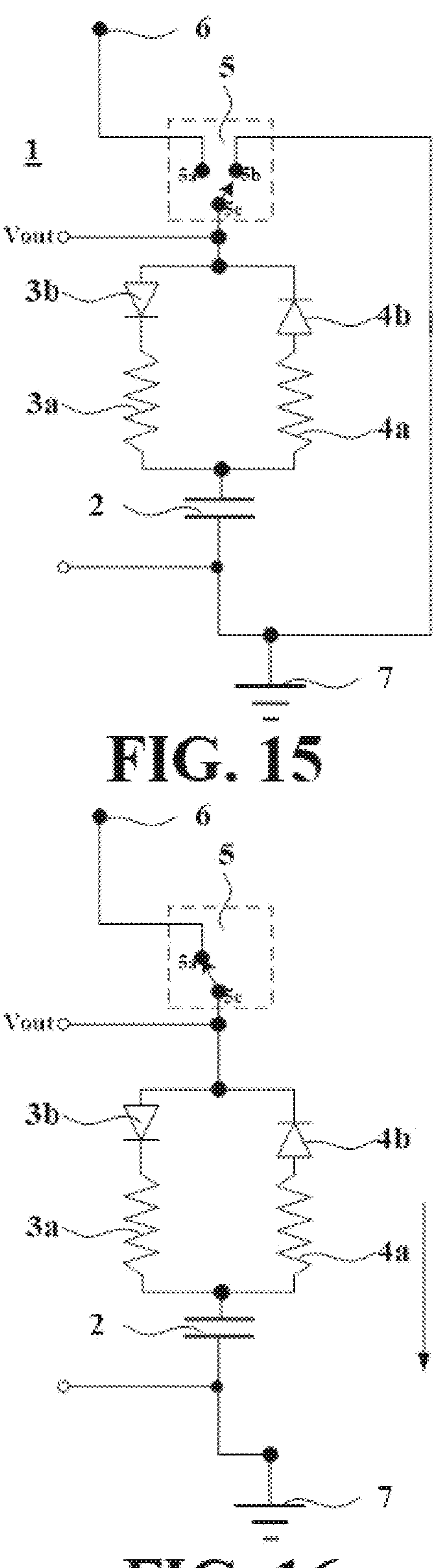
FIG. 15 is a schematic diagram of a magnetoresistive relaxation oscillator type magnetometer provided by an embodiment of the present disclosure.
FIG. 16 is a schematic diagram of charging for FIG. 15.

Referring to FIG. 15, it is a schematic diagram of a magnetoresistive relaxation oscillator type magnetometer provided by an embodiment of the present disclosure. The magnetoresistive relaxation oscillator type magnetometer 1 includes: a capacitor 2, a charging resistor 3, a discharging resistor 4, a charge-discharge transfer switch 5, a high-voltage source terminal 6, a grounding terminal 7 and a signal output terminal Vout. The charging resistor 3 consists of at least one charging magnetoresistance unit, and the discharging resistor 4 consists of at least one discharging magnetoresistance unit. A first end of the capacitor 2 is connected to the grounding terminal 7. Optionally, the charge-discharge transfer switch 5 is a triode bidirectional switch, including an on end 5$a$, an off end 5$b$ and a connecting end 5$c$, wherein the charging resistor 3$a$ is connected in series with a diode 3$b$ with a charging direction turned on to form an RD charging series, the discharging resistor 4$a$ is connected in series with a diode 4$b$ with a discharging direction turned on to form an RD discharging series, the RD charging series and the RD discharging series are connected in parallel to form an RD series, a second end of the capacitor 2 and the RD series are connected in series to form an RC series, the RC series is connected with the connecting end 5$c$, the high-voltage source terminal 6 is connected with the on end 5$a$, and the grounding terminal 7 is connected with the off end 5$b$. In a charging stage, the on end 5$a$ is conducted to the connecting end 5$c$, and in a discharging stage, the off end 5$b$ is conducted to the connecting end 5$c$.

Optionally, the charging resistor and the discharging resistor are opposite in magnetic field sensitive direction and same in sensitivity, and are the same in resistance when no external magnetic field is applied and form a push-pull type magnetoresistor. Optionally, the charging resistor is a magnetic field sensitive magnetoresistance unit.

Figure 17:
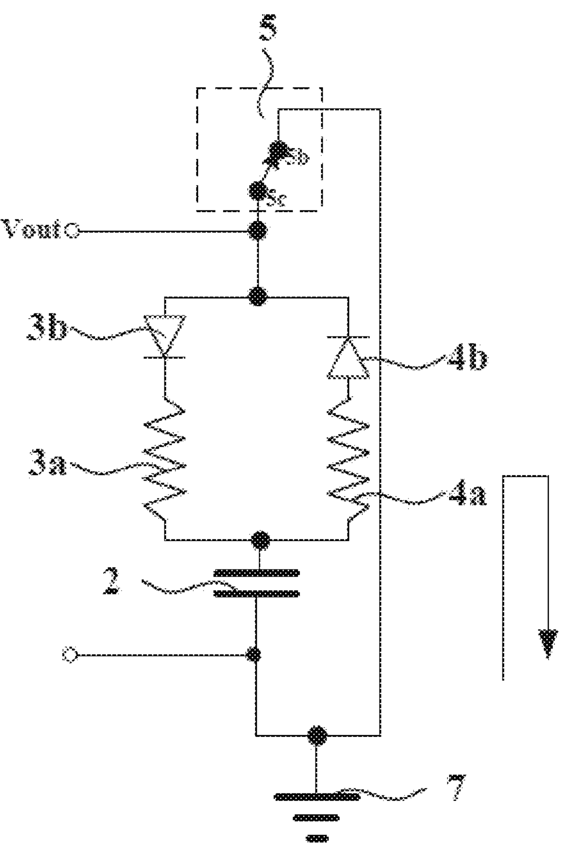
FIG. 17 is a schematic diagram of discharging for FIG. 15.

In the embodiment, the RC series is formed by connecting the capacitor 2 and the RD series in series, the RD series is formed by connecting the RD charging series and the RD discharging series in parallel, and the RC series is located between the grounding terminal 7 and the connecting end 5$c$ of the charge-discharge transfer switch 5. As shown in FIG. 16, in the charging stage, the charge-discharge transfer switch 5 is switched to the high-voltage source terminal 6, that is, the on end 5$a$ is conducted to the connecting end 5$c$ of the charge-discharge transfer switch 5, and the high-voltage source terminal (+Vdd) 6 charges the capacitor 2 via the RD series, with a path of a charging branch as shown by the arrow. As shown in FIG. 17, in the discharging stage, the charge-discharge transfer switch 5 is switched to the grounding terminal 7, that is, the off end 5$b$ is conducted to the connecting end 5$c$ of the charge-discharge transfer switch 5, and the capacitor 2 discharges to the grounding terminal 7 via the RD series, with a path of a discharging branch as shown by the arrow.

An external magnetic field is applied to the magnetometer 1, in the charging stage, the external magnetic field causes resistance change in the RD series, in the discharging stage, the external magnetic field causes resistance change in the RD series, and thus the charge-discharge time of the capacitor is changed. The signal output terminal outputs a charging pulse voltage signal in the charging stage, the charging pulse voltage signal contains one or more harmonic waves of the RD series, the signal output terminal outputs a discharging pulse voltage signal in the discharging stage, and the discharging pulse voltage signal contains one or more harmonic waves of the RD series. A signal processing circuit measures the pulse signals of the signal output terminal to measure the magnitude of the external magnetic field. The number of resistors is reduced in the embodiment.

Figure 18:
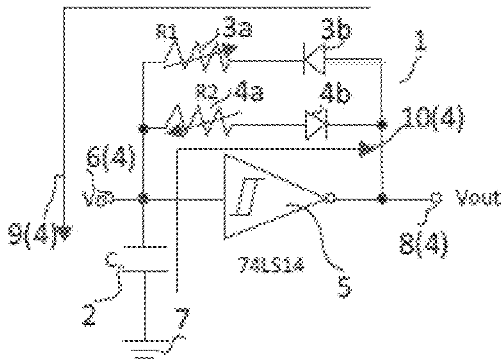
FIG. 18 is a circuit diagram of an equivalent trigger of FIG. 15.

FIG. 18 is a circuit diagram of an equivalent trigger of FIG. 15. The magnetometer 1 further includes: a low-voltage source terminal. The charge-discharge transfer switch is a trigger, an input terminal and an output terminal of the trigger are respectively the high-voltage source terminal or the low-voltage source terminal, the charging resistor is connected in series with a diode with a charging direction turned on to form an RD charging series, the discharging resistor is connected in series with a diode with a discharging direction turned on to form an RD discharging series, the second end of the capacitor is connected to the input terminal of the trigger, the RD charging series and the RD discharging series are connected in parallel, and the two ends of the parallel connected RD charging series and RD discharging series are respectively connected to the input terminal and the output terminal of the trigger, and the signal output terminal is located at the output terminal or the input terminal of the trigger.

The charge-discharge transfer switch 5 is a Schimit trigger, with the input terminal 6(4) and the output terminal 8(4) as the high-voltage source terminal and the low-voltage source terminal respectively. The capacitor 2 is connected between the grounding terminal 7 and the input terminal 6(4), and the two ends of the RD series are respectively connected between the input terminal 6(4) and the output terminal 8(4) of the trigger 5. The charging branch 9(4) includes a charging resistor 3$a$ and a charging diode 3$b$ connected in series, the discharging branch 10(4) includes a discharging resistor 4$a$ and a discharging diode 4$b$ connected in series, and the charging branch 9(4) and the discharging branch 10(5) are connected in parallel.

In the charging stage, the output terminal 8(4) is the high-voltage source terminal, the input terminal 6(4) is the low-voltage source terminal, the output terminal 8(4) charges the capacitor 2 via the charging resistor 3$a$, and the voltage across the capacitor 2 increases. When the voltage is higher than a threshold value Vph, voltage switching occurs across the trigger, that is, the input terminal 6(4) is the high-voltage source terminal, and the output terminal 8(4) is the low-voltage source terminal, and then it enters the discharging stage.

In the discharging stage, the capacitor 2 starts to discharge via the discharging resistor 4$a$, the voltage at the input terminal 6(4) is reduced, and when the voltage is smaller than a threshold value Vp1, voltage reversal occurs at the input terminal 6(4) and the output terminal 8(4) again, and a charging process begins. Therefore, the charging branch 9(4) and the discharging branch 10(4) are implemented via the Schimit trigger 5 and charging and discharging of the capacitor 2.

Figure 19:
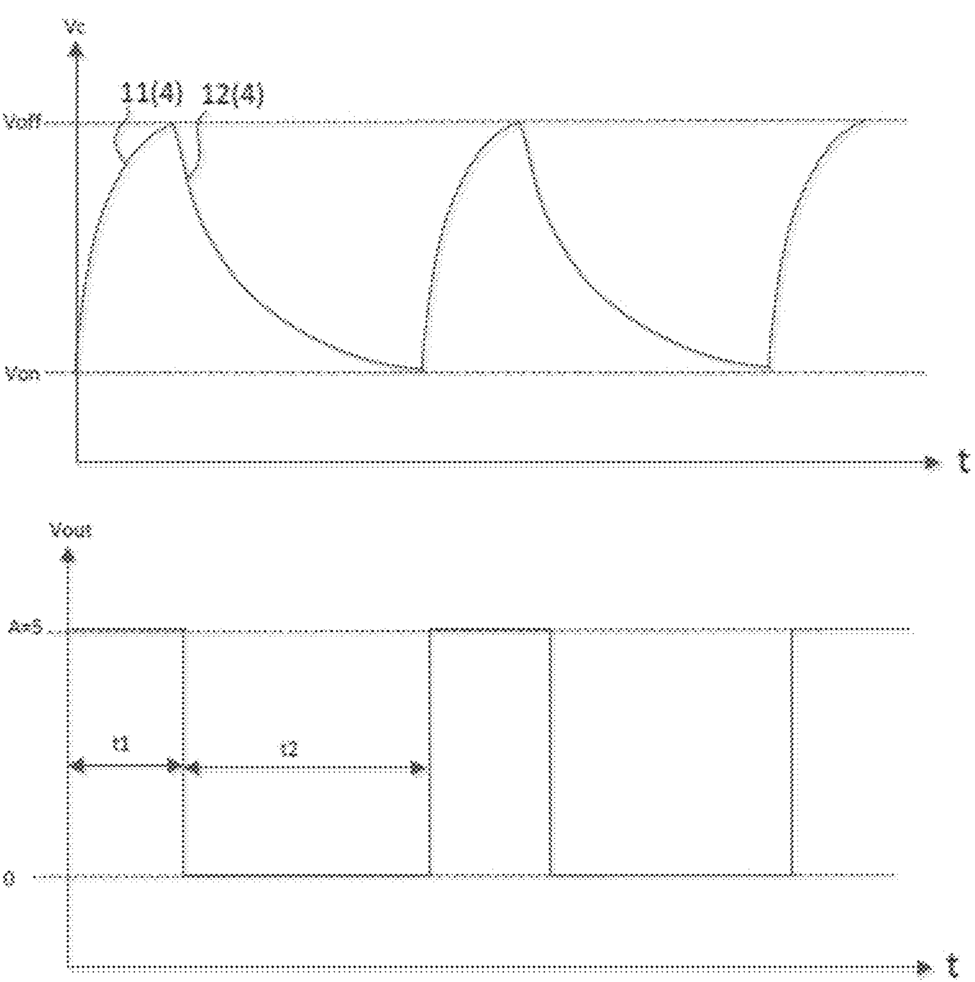
FIG. 19 is a schematic diagram of a capacitor voltage $V_C(t)$ and a voltage Vout(t) at an output terminal of a trigger in FIG. 15.

FIG. 19 is a schematic diagram of a capacitor voltage $V_C(t)$ and a voltage Vout(t) at the output terminal of the trigger in FIG. 15. In the charging stage, a charging characteristic curve 11(4) produced by the voltage $V_C(t)$ across the capacitor is an exponential increasing function, and in the discharging stage, a charging characteristic curve 12(4) produced by the voltage $V_C(t)$ across the capacitor is an exponential decreasing function. Vout(t) is high-low level pulse voltages, wherein charging time is $t_1$, and discharging time is $t_2$.

For an RC series charge-discharge function, an expression of a frequency f thereof as well as the charging time $t_1$ and the discharging time $t_2$ is as follows:

$$f = 0.8/(RC);$$

$$t_1 \propto R_1 C;$$

-continued $$R_2 \propto R_2 C;$$

It can be seen that the charging time $t_1$ is directly proportional to the charging resistor $R_1$, and the discharging time $t_2$ is directly proportional to the discharging resistor $R_2$.

The above solution includes the following three cases:

Case 1, $t_1=t_2$, that is, R and C form a series combination, then charging and discharging are performed, and the charging resistor $R_1$ and the discharging resistor $R_2$ are identical or are the same one common resistor.

Case 2, $t_1$ is changed, $t_2$ is constant, that is, the discharging resistor $R_2$ is kept unchanged, i.e. Is a magnetic-shielding magnetoresistance unit, and only the charging resistor $R_1$ changes with the an external magnetic field H, that is, $R_2$ and $R_1$ constitute a sensitive-reference magnetic resistor pair.

Case 3, $t_1+t_2$=constant, that is, the charging branch $R_1$ and the discharging branch $R_2$ are a push-pull type magnetic resistor pair.

An output pulse function of the signal output terminal is a piecewise periodic function, a period $T=t_1+t_2$, and its basic expression is:

$$V(t) = \begin{Bmatrix} A & 0 \le t \le t_1 \\ 0 & t_1 < t \le t_1 + t_2 \end{Bmatrix};$$

its expanded Fourier series form is:

$$V(t) = \frac{At_1}{t_1+t_2} + \sum_{n=1}^{\infty} \frac{2A}{n\pi} \sin\left(\frac{n\pi t_1}{t_1+t_2}\right) \cos\left(\frac{2n\pi t}{t_1+t_2}\right);$$

where a constant term is $$V_0 = \frac{At_1}{t_1+t_2};$$

a primary term is:

$$V_1(t) = \frac{2A}{\pi} \sin\left(\frac{\pi t_1}{t_1+t_2}\right) \cos\left(\frac{2\pi t}{t_1+t_2}\right);$$

a secondary term is:

$$V_2(t) = \frac{A}{\pi} \sin\left(\frac{2\pi t_1}{t_1+t_2}\right) \cos\left(\frac{4\pi t}{t_1+t_2}\right);$$

Figure 20:
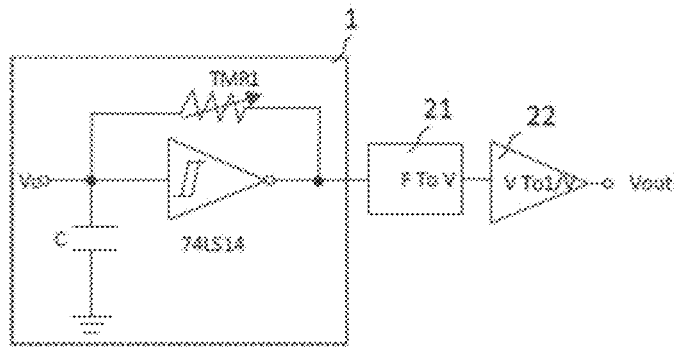
FIG. 20 is a schematic diagram of a magnetoresistive relaxation oscillator type magnetometer provided by an embodiment of the present disclosure.

For a magnetometer 1 containing a single resistor R, $t_1=t_2$, $t_1+t_2=T=2t_1$, and thus a signal processing circuit as shown in FIG. 20 may be adopted. An output terminal of a Schmit trigger of a relaxation oscillator 1(2) is directly and externally connected to a frequency F-voltage V converter 21, and then connected to a V-1/V converter 22, and a finally output voltage is a voltage in the charge-discharge time period T, which is directly proportional to the external magnetic field H. Optionally, the signal output terminal Vout is connected to the F-V converter, the F-V converter converts a pulse signal to a voltage signal, and then the voltage signal is converted by the V-1/V converter into a voltage signal directly proportional to the external magnetic field.

Figure 21:
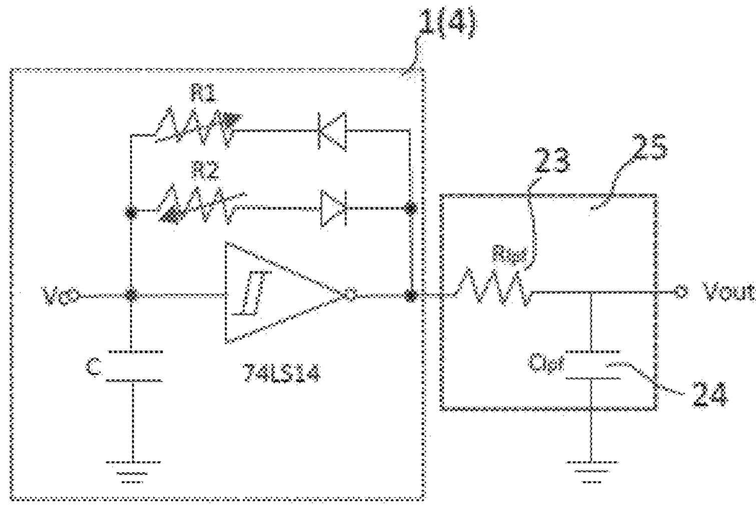
FIG. 21 is a schematic diagram of a magnetoresistive relaxation oscillator type magnetometer provided by an embodiment of the present disclosure.

As shown in FIG. 21, optionally, the signal output terminal Vout is connected to an RC low-pass filter 22, a first end of a first capacitor 24 in the RC low-pass, filter 25 is connected to a grounding terminal, a first resistor 23 in the RC low-pass filter 25 is located between the signal output terminal Vout and a second end of the first capacitor 24, two ends of the first capacitor 24 output a direct current and a first harmonic wave, and the signal processing circuit converts signals across the first capacitor 24 to obtain a charging duration and a discharging duration value.

As described above, the output terminal of the schimit trigger of the relaxation oscillator 1(4) is connected with one Rlpf resistor 23, one Clpf capacitor 24 is connected between the resistor 23 and the ground, and the Rlpf resistor 23 and the Clpf resistor 24 form the RC low-pass filter 25 and then output signals to Vout. It can be seen that by removing a frequency part through the low-pass filter 25, an expression $V_0$ can be directly obtained. In an oscillating circuit of a push-pull combined magnetic resistor pair, $t_1+t_2$=constant, the increase of $t_1$ is directly proportional to R, and the decrease of $t_2$ is directly proportional to R, so that $V_0$ is directly protional to the external magnetic field H.

Another manner is that two or more harmonic waves may be removed by the low-pass filter 25 to obtain $V_0+V_1(t)$. Therefore, a value of $t_1+t_2$ may be obtained by utilizing the frequency f of $V_1(t)$, and $(t_1+t_2)*V_0$ is directly proportional to H.

Figure 22:
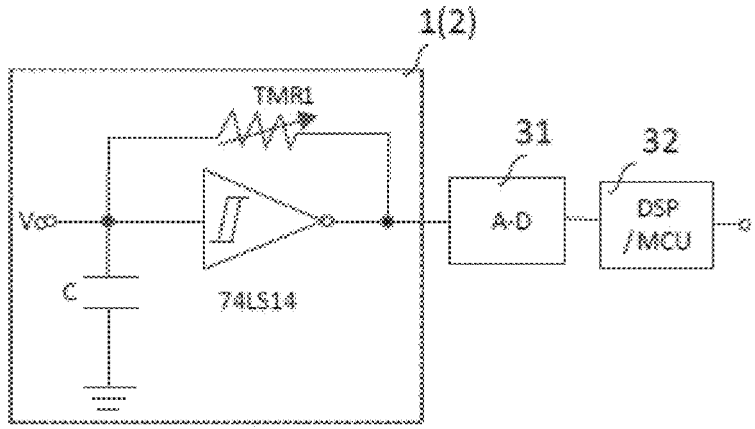
FIG. 22 is a schematic diagram of a magnetoresistive relaxation oscillator type magnetometer provided by an embodiment of the present disclosure.

As shown in FIG. 22, optionally, the signal output terminal of the magnetoresistive relaxation oscillator type magnetometer is connected to an analog-digital converter 31, the pulse signal is converted by the analog-digital converter 31, a converted signal is then processed and output by a microcontroller 32, and the signal processing circuit directly measures the signal output by the microprocessor 32 to obtain a charging duration and a discharging duration. Optionally, the analog-digital converter 31 may convert an analog signal into a digital signal, and the microprocessor 32 is a DSP or an MCU and directly outputs a digital signal related to the external magnetic field H through a certain algorithm. The output terminal of the trigger of the relaxation oscillator 1(2) is connected to the AD converter 31, converts the analog signal to the digital signal and then inputs the digital signal to the MCU/DSP 32, time of a rising edge or a falling edge is directly counted, and values of $t_1$ and $t_2$ are output, which are directly proportional to H.

Figure 23:
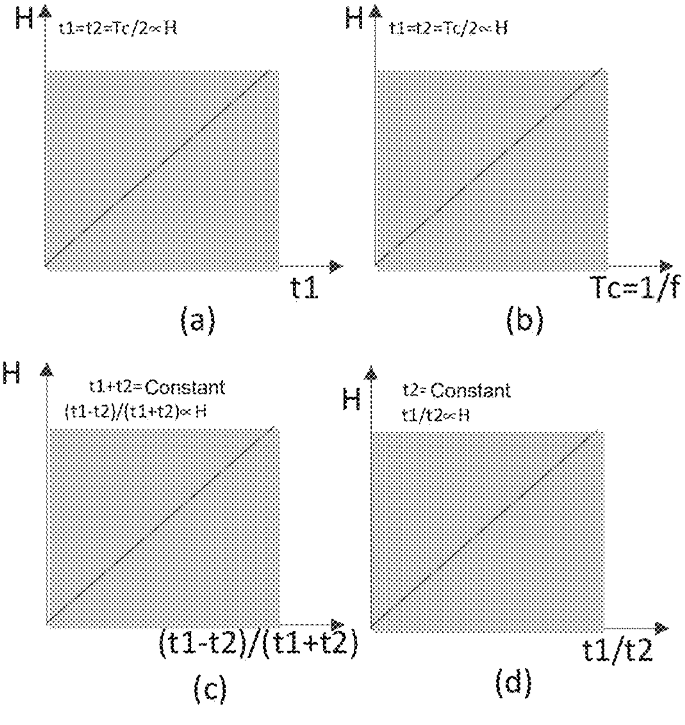
FIG. 23 is a diagram of four typical signal outputs of a relaxation oscillator type magnetometer.

For any embodiment above, FIG. 23 is four typical signal output diagrams of the relaxation oscillator type magnetometer. When the corresponding charging resistor and discharging resistor in FIG. (a) are the common resistor, the charging time $t_1$ is equal to the discharging time $t_2$, and at the moment, the value of H may be obtained by measuring the time $t_1$; similarly, when the corresponding charging resistor and discharging resistor in FIG. (b) are the common resistor, the period $T=t_1+t_2$ or the pulse frequency f are directly measured, 1/f is calculated, and then the value of H may be measured; FIG. (c) is the push-pull type magnetic resistor pair, t $1+t_2$=constant, and $(t_1-t_2)/(t_1+t_2)$ is directly proportional to the external magnetic field H; and FIG. (d) is a sensitive reference type magnetic resistor pair, $t_2$=constant, and $t_1/t_2$ is directly proportional to the external magnetic field H.

Note that the above is only a preferred embodiment of the present disclosure and the applied technical principles. Those skilled in the art will understand that the present disclosure is not limited to the specific embodiment described here, and that for those skilled in the art, various obvious changes, readjustments, mutual combinations and substitutions can be made without departing from the scope of protection of the present disclosure. Therefore, although the present disclosure has been described in more detail through the above embodiment, the present disclosure is not limited to the above embodiment. Without departing from the concept of the present disclosure, more equivalent embodiments may also be included, and the scope of the present disclosure is determined by the scope of the appended claims.

The invention claimed is:

1. A magnetoresistive relaxation oscillator type magnetometer, comprising: a capacitor, a charging resistor, a discharging resistor, a charge-discharge transfer switch, a high-voltage source terminal, a grounding terminal and a signal output terminal, the charging resistor consisting of at least one charging magnetoresistance unit, and the discharging resistor consisting of at least one discharging magnetoresistance unit; wherein a first end of the capacitor is connected to the grounding terminal, a second end of the capacitor is respectively connected to the charging resistor, the discharging resistor and the signal output terminal via the charge-discharge transfer switch, and the charge-discharge transfer switch is further connected to the high-voltage source terminal;

in a charging stage, the charge-discharge transfer switch is switched to the high-voltage source terminal, and the high-voltage source terminal charges the capacitor via the charging resistor; while in a discharging stage, the charge-discharge transfer switch is switched to the grounding terminal, so that the capacitor discharges to the grounding terminal via the discharging resistor; and when an external magnetic field causes resistance change in the charging resistor and the discharging resistor, charge-discharge time of the capacitor is changed, a pulse signal output by the signal output terminal contains one or more harmonic waves of the charging resistor or the discharging resistor, and a signal processing circuit measures the pulse signal to measure the external magnetic field.

2. The magnetoresistive relaxation oscillator type magnetometer according to claim 1, wherein the charging magnetoresistance unit and the discharging magnetoresistance unit are anisotropic magnetoresistance units, giant magnetoresistance units or tunnel magnetoresistance units.

3. The magnetoresistive relaxation oscillator type magnetometer according to claim 1, wherein the charge-discharge transfer switch is a metal-oxide semiconductor field effect transistor MOSFET, wherein the second end of the capacitor and a second end of the charging resistor are both connected to a gate of the MOSFET, the discharging resistor is located between a drain of the MOSFET and the grounding terminal, and the high-voltage source terminal is respectively connected to a first end of the charging resistor and a source of the MOSFET; or the charge-discharge transfer switch is a triode, wherein the second end of the capacitor and the second end of the charging resistor are both connected to a base of the triode, the discharging resistor is located between an emitter of the triode and the grounding terminal, and the high-voltage source terminal is respectively connected to the first end of the charging resistor and a collector of the triode.

4. The magnetoresistive relaxation oscillator type magnetometer according to claim 3, wherein the charging resistor and the discharging resistor are opposite in magnetic field sensitive direction and same in sensitivity, and are same in resistance when no external magnetic field is applied and form a push-pull type magnetoresistor.

5. The magnetoresistive relaxation oscillator type magnetometer according to claim 3, wherein the charging resistor is a magnetic field sensitive magnetoresistance unit.

6. The magnetoresistive relaxation oscillator type magnetometer according to claim 1, wherein the charge-discharge transfer switch is a triode bidirectional switch, comprising an on end, an off end and a connecting end, wherein the high-voltage source end is connected with the on end via the charging resistor, the grounding terminal is connected with the off end via the discharging resistor, and the second end of the capacitor is connected with the connecting end; and in a charging stage, the on end is conducted to the connecting end, and in a discharging stage, the off end is conducted to the connecting end.

7. The magnetoresistive relaxation oscillator type magnetometer according to claim 1, wherein the charge-discharge transfer switch is a triode bidirectional switch, comprising an on end, an off end and a connecting end, wherein the charging resistor and the discharging resistor are the same one common resistor, the second end of the capacitor and the common resistor are connected in series to form an RC series, the RC series is connected with the connecting end, the high-voltage source terminal is connected with the on end, and the grounding terminal is connected with the off end; and;

in a charging stage, the on end is conducted to the connecting end, and in a discharging stage, the off end is conducted to the connecting end.

8. The magnetoresistive relaxation oscillator type magnetometer according to claim 7, wherein the signal output terminal is connected to an F-V converter, the F-V converter converts the pulse signal into a voltage signal, and then the voltage signal is converted by a V-1/V converter into a voltage signal directly proportional to the external magnetic field.

9. The magnetoresistive relaxation oscillator type magnetometer according to claim 1, wherein the charge-discharge transfer switch is a triode bidirectional switch, comprising an on end, an off end and a connecting end, wherein the charging resistor is connected in series with a diode with a charging direction turned on to form an RD charging series, the discharging resistor is connected in series with a diode with a discharging direction turned on to form an RD discharging series, the RD charging series and the RD discharging series are connected in parallel to form an RD series, the second end of the capacitor and the RD series are connected in series to form an RC series, the RC series is connected with the connecting end, the high-voltage source terminal is connected with the on end, and the grounding terminal is connected with the off end; and in a charging stage, the on end is conducted to the connecting end, and in a discharging stage, the off end is conducted to the connecting end.

10. The magnetoresistive relaxation oscillator type magnetometer according to claim 1, further comprising: a low-voltage source terminal; wherein the charge-discharge transfer switch is a trigger, an input terminal and an output terminal of the trigger are respectively the high-voltage source terminal or the low-voltage source terminal, the charging resistor and the discharging resistor are the same one common resistor, the second end of the capacitor is connected to the input terminal of the trigger, two ends of the common resistor are respectively connected to the input terminal and the output terminal of the trigger, and the signal output terminal is located at the output terminal or the input terminal of the trigger.

11. The magnetoresistive relaxation oscillator type magnetometer according to claim 1, further comprising: a low-voltage source terminal; wherein the charge-discharge transfer switch is a trigger, an input terminal and an output terminal of the trigger are respectively the high-voltage source terminal or the low-voltage source terminal, the charging resistor is connected in series with a diode with a charging direction turned on to form an RD charging series, the discharging resistor is connected in series with a diode with a discharging direction turned on to form an RD discharging series, the second end of the capacitor is connected to the input terminal of the trigger, the RD charging series and the RD discharging series are connected in parallel, and two ends of the parallel connected RD charging series and RD discharging series are respectively connected to the input terminal and the output terminal of the trigger, and the signal output terminal is located at the output terminal or the input terminal of the trigger.

12. The magnetoresistive relaxation oscillator type magnetometer according to claim 1, wherein the signal output terminal is connected to an RC low-pass filter, a first end of a first capacitor in the RC low-pass filter is connected to the grounding terminal, a first resistor in the RC low-pass filter is located between the signal output terminal and a second end of the first capacitor, two ends of the first capacitor output a direct current and a first harmonic wave, and the signal processing circuit converts signals across the first capacitor to obtain a charging duration and a discharging duration value.

13. The magnetoresistive relaxation oscillator type magnetometer according to claim 1, wherein the signal output terminal is connected to an analog-digital converter, the pulse signal is converted by the analog-digital converter, a converted signal is then processed and output by a microcontroller, and the signal processing circuit directly measures the signal output by the microprocessor to obtain a charging duration and a discharging duration.

* * * * *